United States Patent [19]

Belbel et al.

[11] Patent Number: 4,782,419
[45] Date of Patent: Nov. 1, 1988

[54] INHIBITABLE STATIC SWITCH FOR AN AC ELECTRIC CIRCUIT INCLUDING AN INDUCTIVE LOAD

[75] Inventors: Elie Belbel, Epinay sur Seine; Louis Fechant, Le Vesinet; Jean-Paul Riotte, Epinay sur Seine; Bruno Vitale, Ermont, all of France

[73] Assignee: La Telemecanique Electrique, France

[21] Appl. No.: 4,010

[22] Filed: Jan. 13, 1987

[30] Foreign Application Priority Data

Jan. 13, 1986 [FR] France ................................ 86 00345

[51] Int. Cl.⁴ ............................................ H02H 7/09
[52] U.S. Cl. ........................................ 361/33; 361/58; 361/91; 361/100
[58] Field of Search ................ 361/31, 33, 58, 86, 361/87, 91, 100, 95, 98, 93, 101, 111

[56] References Cited

U.S. PATENT DOCUMENTS 4,415,945 11/1983 Periot ................................ 361/100

Primary Examiner—A. D. Pellinen
Assistant Examiner—Todd E. DeBoer
Attorney, Agent, or Firm—William A. Drucker

[57] ABSTRACT

A static switch is provided for controlling the closing and opening of an AC electric circuit including an inductive load. This switch includes an inhibitable thyristor having an RCD network for protection against the voltage gradients on turn-off. The anode-cathode path of the inhibitable thyristor and its protection network are connected to the AC energy source through a full wave rectifier device, whereas a voltage clipping member is disposed at the terminals of the rectifying device.

2 Claims, 3 Drawing Sheets

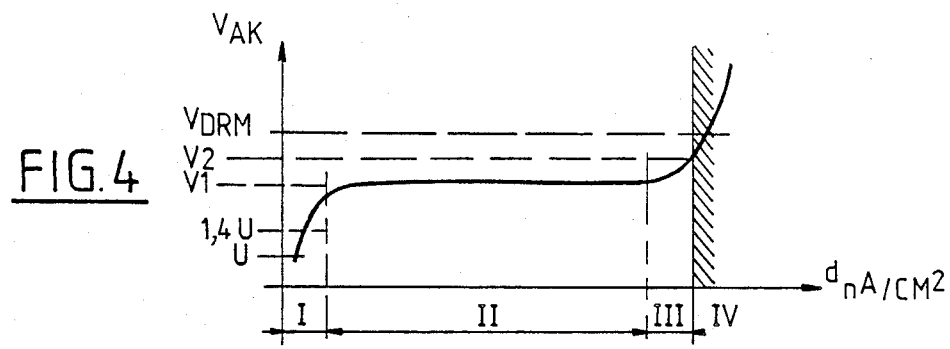
FIG. 4
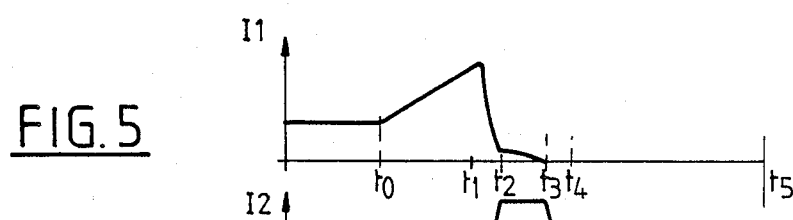
FIG. 5
FIG. 6
FIG. 7
FIG. 8
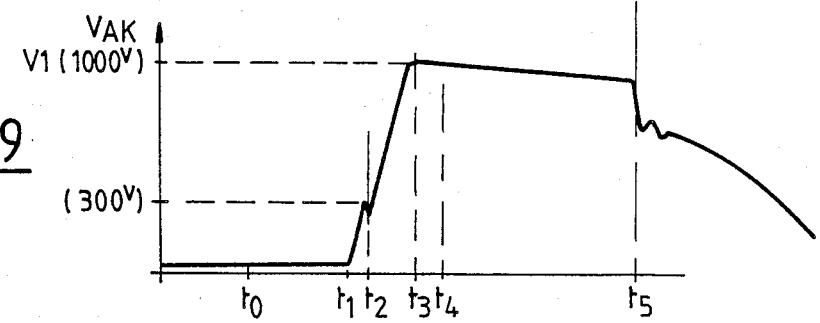
FIG. 9

INHIBITABLE STATIC SWITCH FOR AN AC ELECTRIC CIRCUIT INCLUDING AN INDUCTIVE LOAD

BACKGROUND OF THE INVENTION

1. Field of the Invention

The invention relates to a static switch adapted for controlling the opening and closing of an AC electric circuit including an inductive load. The static switch considered includes a component of the inhibitable thyristor type having a gate control circuit and a protective network against voltage gradients.

By inhibitable thyristor will be meant hereafter any controllable turn-off PNPN semiconductor structure either of the bipolar type called GTO (gate turn-off), or of the MOS reaction bipolar type for example known under the commercial names IGT, COMFET, or BIFET, or of the static induction type (SIT). From this application inhibitable thyristors are obviously excluded thyristors properly speaking (SCR).

By gate will be meant not only the gate of a GTO or SIT component but also the MOS gate of an MOS bipolar reaction component.

2. Description of the Prior Art

As is known, precautions must be taken for protecting such components against forward voltage increase gradients following turn-off since this latter only takes place exceptionally at current zero.

For this, it is customary to associate in parallel with the anode-cathode path of the inhibitable thyristor a protective network formed of the series connection of a capacity C and means for charging and discharging this capacity, these means being formed by a parallel resistor R—diode D circuit (RCD network or "snubber"). The capacity charges via the diode during turn-off by attenuating the increased slope of the anode-cathode voltage of the inhibitable thyristor, then is discharged into the resistor at the time of turn-on of the inhibitable thyristor.

It has already been proposed to form choppers using inhibitable thyristors having an RCD network for protection against voltage gradients.

It is however difficult to transpose such static apparatus to controlling the opening and closing of an AC circuit with inductive load while providing correct protection for the inhibitable thyristor against the voltage surges generated at the time of turn-off thereof because of the discharge current of the inductance and/or of overload or short circuit currents.

To construct such a static switch, it is known to associate two inhibitable thyristors in an antiparallel circuit, each thyristor being provided with its own RCD protection network. It has however proved that, when the antiparallel circuit is connected to an AC circuit, its reverse voltage resistance must be ensured by specific components when inhibitable thyristors are used having a low reverse voltage resistance as is the case of most of the inhibitable PNPN components available commercially.

In addition, a leak current flows through the capacity of one of the RCD protection networks. Now this is inadmissable for a static switch controlling a low voltage load.

In the published patent application JP No. 59-184 412, a reverse voltage resistance diode is provided in series or in parallel with each inhibitable thyristor, but this does not solve the problem of the leak current when the switch is disabled or inhibited.

To avoid this leak current, it has been proposed to provide two inhibitable thyristors in an antiparallel circuit at the terminals of the AC circuit, this antiparallel circuit being itself disposed in parallel with a full wave rectifier bridge whose branches include diodes alternately representative of the D element of the RCD network.

At the DC terminals of the bridge are disposed a capacity forming the C element of the RCD network and a series circuit including a resistor forming the R element of the RCD network and an auxiliary thyristor which may be turned on for discharging the capacity.

The advantage of this switch is to avoid a permanent leak current. It has however the drawback of requiring two inhibitable thyristors with identical forward voltage behavior, which goes hand in hand with a high price and with difficulties in obtaining such components. In addition, it is necessary to provide, in addition to two power supplies and two gate control circuits, an isolated control for the auxiliary thyristor.

SUMMARY OF THE INVENTION

The purpose of the invention is more particularly to avoid these drawbacks in a static switch adapted for switching off an AC circuit, particularly a low voltage circuit with inductive load, in response to a normal service control or to the detection of an overcurrent in the circuit, using a simplied circuit allying the absence of leak current with protection against over voltages adapted to difficult turn-off conditions.

A further aim is to provide a simplified circuit using in combination a single inhibitable thyristor and inexpensive components which, depending on the case, take over the reverse voltage resistance and extend the forward voltage resistance of the inhibitable thyristor.

A further aim is to optimize the protection of the inhibitable thyristor of the switch against over voltages.

In accordance with the invention, the anodecathode path of the inhibitable thyristor and its network of protection against voltage gradients on turn-off are connected to the AC energy source through a full wave rectifying device, whereas a voltage clipping means is disposed at the terminals of the rectifying device. The inhibitable thyristor may thus be a component with a reduced reverse voltage resistance, so of low cost price, since the rectifying device relieves if of such a reverse voltage behavior requirement. Similarly, the forward voltage resistance only needs to be provided up to the vicinity of the voltage threshold of the clipping means.

In addition, as soon as the turn-off signal is applied to the gate of the inhibitable thyristor, the capacity of the protection network is charged to a value between the peak voltage of the AC circuit and the voltage threshold of the clipping means and prevents a leak current passing via said network when the switch is disabled.

When the turn-off signal is generated following the detection of a short circuit current, the non linear resistance of the voltage clipping means decreases suddenly for a first predetermined voltage threshold; the short circuit current may thus flow and be dissipated in the voltage clipping means. This latter is adapted for reversibly withstanding the passage of high short circuit currents and it is preferably formed by a metal oxide, for example ZnO, varistor.

In a first embodiment, advantageous because of its great simplicity, the voltage clipping means is a varistor connected to the DC voltage terminals of the rectifying device. Thus, during the turn-off procedure, the capacity of the protection network once charged does not risk breaking down the inhibitable thyristor because the varistor imposes a given potential difference at the terminals of the capacity.

In a second embodiment, the voltage clipping means is a varistor connected to the AC voltage terminals of the rectifying device and, on the DC side of this latter is provided a non linear member having a second predetermined voltage threshold greater than said first voltage threshold.

This non linear member may be formed by a second varistor disposed in parallel with the anode-cathode path of the inhibitable thyristor. It is however preferably formed by a break-over diode disposed in an anode-gate short circuit path of the inhibitable thyristor, so as to establish a gate current providing correct turn-on of the inhibitable thyristor should the second voltage threshold be exceeded. This second voltage threshold is strictly lower than the forward voltage resistance guaranteed by the supplier and it is greater than the clipping voltage of the varistor for the fault currents normally provided for.

The result is that the first varistor is operated under an AC voltage, which allows more reliable and more durable use thereof than in the case of a varistor biased with a DC voltage. The non linear member having the second voltage threshold allows the discharge current of the capacity to flow or an exceptional fault current.

So as to provide turn-on of the inhibitable thyristor even in the presence of a short circuit, the capacity of the protection network is preferably determined for being successively discharged and recharged on turn-on sufficiently rapidly to avoid damage to the thyristor.

The inhibitable thyristor, its protection network and the full wave rectifier device, formed preferably by an ordinary power diode bridge, may be disposed on the same substrate, made for example from alumina; the power diode bridge is then provided for occupying a considerable part of the area of the substrate so as to keep the voltage drop of the bridge low in the enabled state of this switch.

In one embodiment particularly appropriate to the application of the switch as static circuit makerbreaker, the gate control circuit of the inhibitable thyristor has a means for reading the current flowing through the thyristor, the output of this means being connected to a means for detecting the short circuits and to a means for detecting the current zero, as well as a logic to which are applied on the one hand the output signals of these two means and on the other a turn-off control signal in normal service, so as to deliver a gate signal either at the first current zero following the appearance or the change of state of the control signal in the absence of a short circuit or immediately in the presence of a short circuit.

The advantage of this is to act less on the varistor and to extend the lifespan of the switch.

BRIEF DESCRIPTION OF THE DRAWINGS

The invention will be better understood from reading the following description with reference to the accompanying drawings in which:

FIG. 4 is a graph showing the variation of the voltage at the terminals of a GTO thyristor as a function of its current density;

FIGS. 5 to 9 are timing diagrams illustrating the operation of the static switch during a turn-off procedure.

DESCRIPTION OF THE PREFERRED EMBODIMENT

Figure 1:
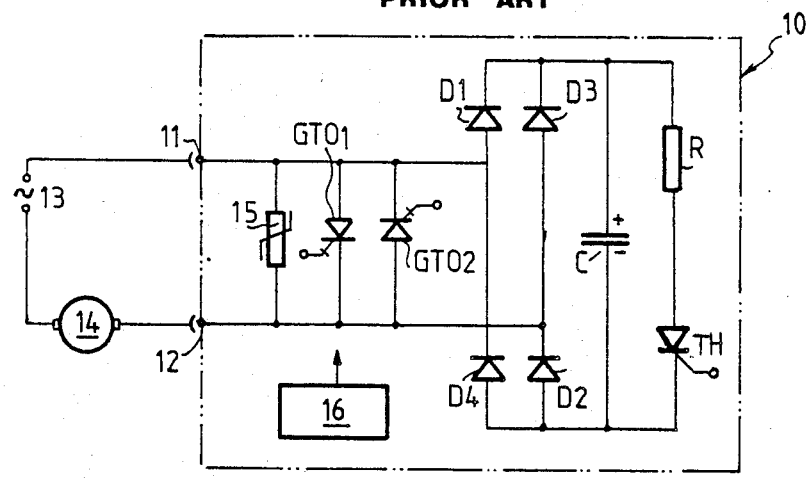
FIG. 1 is a diagram of one example of a bidirectional static switch which does not form part of the invention.

The static switch 10 illustrated in FIG. 1 has moreover been shown in the patent application FR- No. 85 08381 of the 4th June 1985.

It includes two terminals 11, 12 for connection to an AC circuit including an AC power source 13 and an inductive load 14.

The switch includes an anti-parallel circuit of two inhibitable thyristors GTO1, GTO2 and, in parallel with the anode-cathode path of the two thyristors, a varistor 15 and a bridge of diodes D1–D4 disposed opposite the terminals 11, 12 with respect to the thyristors GTO1, GTO2. The DC voltage terminals of the diode bridge D1–D4 are connected to a parallel circuit formed of a capacity C and of the series connection of a resistor R and an auxiliary thyristor TH. A circuit 16 for controlling the gates ensures the control for turning-on the components GTO1, GTO2, TH and for turning off the components GTO1, GTO2.

Turn-off of the inhibitable thyristors may take place either in response to a voluntary command, or in response to an over current—overload or short circuit current—detected in the main current path of the switch 10.

The advantages of this switch is to suppress the leak current following DC biasing of the capacity of the protection circuit; but it has the drawbacks already mentioned.

Figure 2:
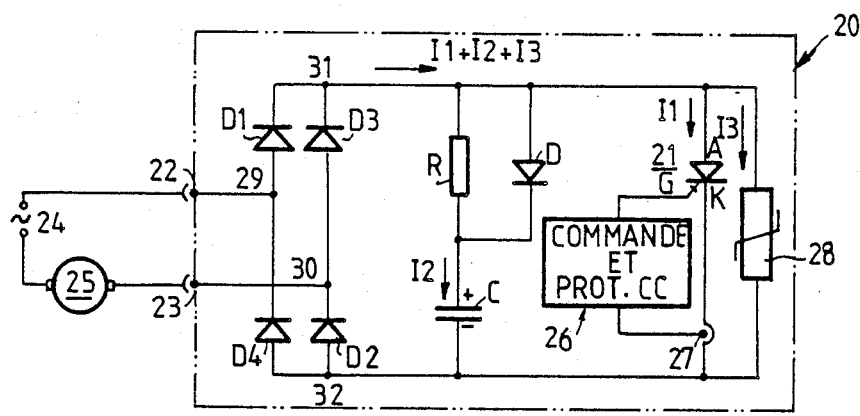
FIG. 2 is the diagram of a static switch in accordance with the invention in a first embodiment using a GTO or MOS bipolar reaction component.

In the diagram of the invention shown in FIG. 2, the static switch 20 has an inhibitable thyristor 21 whose anode A and cathode K are connected to terminals 22, 23 of switch 20 which are connectable to a low voltage AC circuit including an AC power source 24 and a more or less inductive load 25. In the present embodiment, the inhibitable thyristor is a GTO thyristor, but the following description would also be valid if it were a question of an MOS bipolar reaction component or a static induction thyristor.

A circuit 26 is provided for controlling the gate G of the inhibitable thyristor 21 for applying thereto, depending on the case, a turn-on signal or a turn-off signal, in this latter case in response to a control signal or to the detection of an overcurrent in the circuit by means of the current reading member 27.

An RCD protection network is associated in parallel with the anode-cathode path of the inhibitable thyristor 21 so as to protect it against voltage gradients at the beginning of turn-off. There is also provided, in parallel with the anode-cathode path of the inhibitable thyristor, on the one hand a voltage clipper formed here by a zinc oxide varistor 28 and on the other hand, a full wave ordinary power diode bridge rectifier D1–D4. The AC voltage terminals 29, 30 of the bridge are connected to the respective terminals 22, 23 of the switch, whereas the DC voltage terminals 21, 32 of the bridge are connected to the electrodes, A, K of the inhibitable thyristor and to the terminals of the varistor 28.

The reverse voltage resistance of the inhibitable thyristor 21 is then of no consequence and it may be formed by an inexpensive GTO component; its protection against over voltages is provided even in the presence of a purely inductive load by the varistor. When the GTO thyristor is inhibited or disabled, no leak current transists through the capacity C which remains charged.

Figure 3:
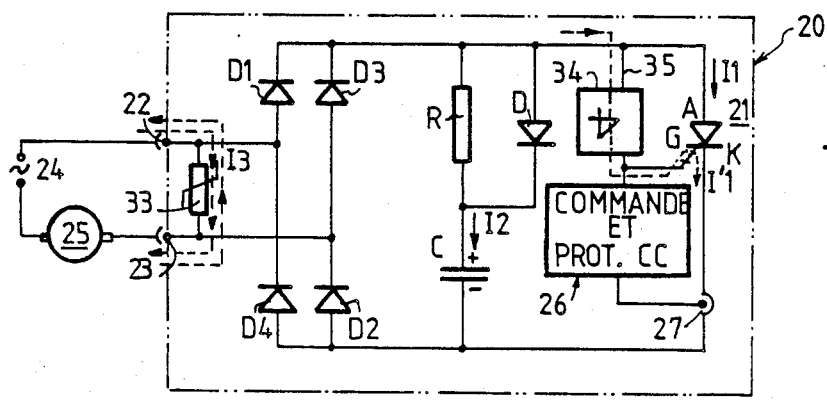
FIG. 3 is the diagram of the static switch of the invention in a second embodiment.

In the diagram shown in FIG. 3, the voltage clipping member is formed by a zinc oxide varistor 33 whose terminals are connected to the AC voltage terminals 29, 30 of the bridge D1–D4. So that capacity C does not risk overloading the component 21, in a bypass between the anode A and gate G of the thyristor a non linear element 34 is provided, preferably a break-over diode which is enabled for a second predetermined voltage threshold V2 greater than the first threshold V1, so that a brief current flows through the gate for correctly turning on the component 21.

FIG. 4 shows the variation of the voltage $V_{AK}$ at the terminals of the thyristor GTO21 of FIG. 3 as a function of the current density d. There have been shown the voltage threshold V1 of the varistor 33 and the voltage threshold V2 of the break-over diode 34, as well as the voltage U of the network, for example 220 or 380 volts. Four operating zones I, II, III, IV of the inhibitable thyristor may be distinguished, namely: a zone I of operation as circuit maker, for which turn-off is controlled systematically at the current zero in accordance with the block diagram shown in FIG. 10, a zone II of operation protected by the clipper varistor, an operating zone III protected by the break-over diode and a prohibited operating zone IV.

The procedure for turning off the GTO thyristor switch of FIG. 3 will be explained with reference to the timing diagrams of FIGS. 5 to 9.

With the GTO thyristor assumed to be enabled, a fault signal (short circuit current) is generated at time $t_0$ by the control circuit 26, which results in the application of a negative signal to the gate G of the thyristor.

The current 1 which flows through the thyristor rises up to time $t_1$ at which the capacity C of the RCD network begins to charge; at time $t_2$, the current I1 has sufficiently decreased, as well as the voltage gradient dV/dt and the voltage $V_{AK}$ which shows a slight leap at about 300 volts and increases up to time $t_3$. The threshold V1 of the varistor, for example of the order of 1000 volts, is then reached and this varistor begins to conduct and to dissipate the excess energy. At time $t_4$, capacity C has ceased charging and the current I3 in the varistor reaches a plateau; current I3 then begins to decrease until time $t_5$ at which the voltage at the terminals of the inhibitable GTO thyristor may again resume its value of the voltage of the rectified AC circuit.

The switch described is a single pole switch. A multi-pole switch may of course be formed by associating several poles such as described.

Figure 10:
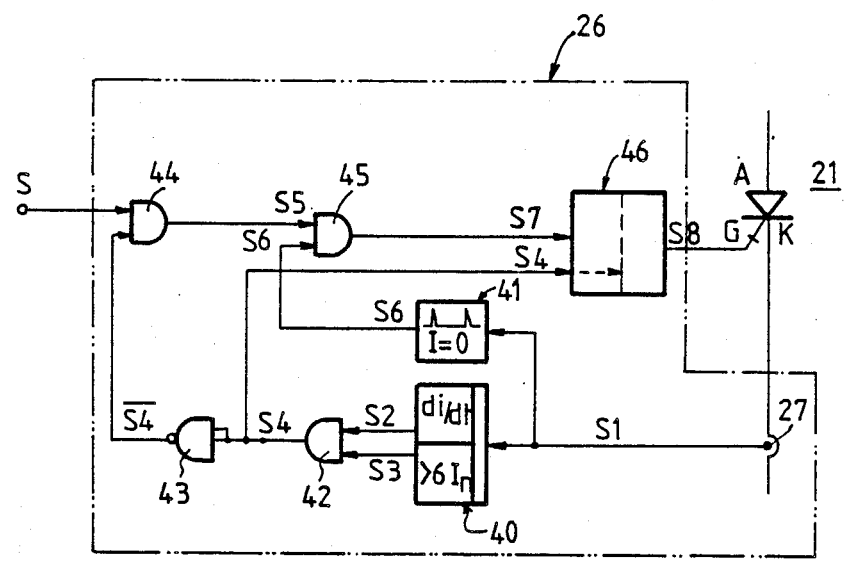
FIG. 10 is a block diagram of one embodiment of a gate control circuit in accordance with the invention.

The block diagram of FIG. 10 shows one embodiment of a circuit for controlling an inhibitable static switch for AC current in accordance with the invention, allowing turn-off of the inhibitable thyristor under normal service conditions at the current zero for sparing the varistor (circuit maker function) and immediate turn-off in the case of a short circuit current (circuit breaker function).

Control of the turn-on of the inhibitable thyristor is not described for it is not essential for understanding the invention.

The control circuit 26 has a member 27 for reading the current which delivers the signal S1 which is the image of the current flowing through the inhibitable thyristor 21. Signal S1 is fed on the one hand to a processing member 40 which generates a signal S2 indicating overshooting of a threshold di/dt and a signal S3 indicating overshooting of a current threshold, and on the other hand to a member 41 which generates validation pulses S6 corresponding to the zero cross over of the current.

Signals S2 and S3 are combined in an AND gate 42 whose output signal S4 is, on the one hand, complemented by an inverter 43 and, on the other, applied to the output stages of a gate control circuit 46. This latter delivers then a negative gate signal S8 as soon as a short circuit current is detected.

Breaking of the circuit under normal service conditions is determined in response to the appearance or to the change of state of a turn-off control signal S. The signal S is combined with the signal S4 in an AND gate 44 whose output signal S5 is itself combined with the validation pulses S6 in an AND gate 45. The output signal S7 of this latter is applied to the input of circuit 46 so that the signal S8 is only applied to the gate on the zero cross over of the anode-cathode current under normal service conditions.

What is claimed is:

1. In an AC electric circuit supplied from an AC energy source and including an inductive load, a static switch comprising:
   an inhibitable thyristor whose anode and cathode are connected to terminals of said static switch which are connectable to the AC circuit,
   a circuit controlling the gate of the inhibitable thyristor by applying thereto a turn-on signal and a turn-off signal, said turn-off signal being applied in response to a control signal under normal service conditions or to a signal indicating an overcurrent in the circuit,
   a network of protection against the voltage gradients disposed in parallel with the anode-cathode path of the inhibitable thyristor, this network including a capacity having means charging on turn-off and discharging on turn-on, wherein:
   the anode-cathode path of the inhibitable thyristor and its network of protection against the voltage gradients on turn-off are connected to the AC energy source through a full-wave rectifier device,
   a voltage clipping member is disposed at the terminals of the rectifier device, said voltage clipping member comprising a varistor connected to the AC voltage terminals of the rectifier device and having a first predetermined voltage threshold, whilst there is provided, on the DC side of the rectifier device, a non linear member having a second predetermined voltage threshold greater than said first threshold, said non linear member comprising a break-over diode disposed in an anode-gate short circuit path of the inhibitable thyristor.

2. The static switch as claimed in claim 1, wherein the circuit for controlling the gate of the inhibitable thyristor comprises measuring means for reading the current flowing through the thyristor, said measuring means having an output, first means for detecting short circuits and second means for detecting the current zero, said first and second means being connected to the output of the measuring means and having respectively first and second outputs, and logic means having first and second inputs respectively connected to said first and second outputs, said logic means having a third input on which is applied a control signal for controlling turn-off under normal service conditions, said logic means having an output on which is delivered a gate signal either at the first current zero following said control signal in the absence of a short circuit, or immediately in the presence of a short circuit.

* * * * *